(12) United States Patent
Yoshida et al.

(10) Patent No.: US 9,017,564 B2
(45) Date of Patent: Apr. 28, 2015

(54) PLASMA ETCHING METHOD

(71) Applicant: Hitachi High-Technologies Corporation, Minato-ku, Tokyo (JP)

(72) Inventors: Atsushi Yoshida, Kudamatsu (JP); Naohiro Yamamoto, Kudamatsu (JP); Makoto Suyama, Shunan (JP); Kentaro Yamada, Shunan (JP); Daisuke Fujita, Kudamatsu (JP)

(73) Assignee: Hitachi High-Technologies Corporation (JP)

( * ) Notice: Subject to any disclaimer, the term of this patent is extended or adjusted under 35 U.S.C. 154(b) by 0 days.

(21) Appl. No.: 13/761,235

(22) Filed: Feb. 7, 2013

(65) Prior Publication Data

US 2014/0144873 A1    May 29, 2014

(30) Foreign Application Priority Data

Nov. 27, 2012   (JP) ................. 2012-258087

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *G11C 11/02* | (2006.01) |
| *H01L 43/12* | (2006.01) |

(52) U.S. Cl.
CPC ............. *G11C 11/02* (2013.01); *H01L 43/12* (2013.01)

(58) Field of Classification Search
None
See application file for complete search history.

(56) References Cited

U.S. PATENT DOCUMENTS

2010/0301008 A1 * 12/2010 Shinde et al. ............... 216/22
2013/0029431 A1    1/2013 Takahashi et al.

FOREIGN PATENT DOCUMENTS

| JP | 2003-78184 | 3/2003 |
|---|---|---|
| JP | 2005-314791 | * 11/2005 |

OTHER PUBLICATIONS

Korean Official Action dated Mar. 30, 2014, for KR Application No. 10-2013-14446.

* cited by examiner

*Primary Examiner* — Stephanie Duclair
(74) *Attorney, Agent, or Firm* — Baker Botts L.L.P.

(57) ABSTRACT

A plasma etching method performs plasma etching on a sample, which has laminated films containing a variable layer of a magnetic film, a barrier layer of an insulating material, and a fixed layer of a magnetic film, using a hard mask, which includes at least one of a Ta film and a TiN film. The plasma etching method includes a first step of etching the laminated films using $N_2$ gas; and a second step of etching the laminated films after the first step using mixed gas of $N_2$ gas and gas containing carbon elements.

8 Claims, 6 Drawing Sheets

PLASMA ETCHING METHOD

BACKGROUND OF THE INVENTION

The present invention relates to a plasma etching method, and more particularly to a plasma etching method for plasma etching a magnetic material.

Today, development efforts are underway for a magnetoresistive random access memory (MRAM) in which data is stored in a magnetic tunnel junction (MTJ) device (hereinafter referred to as an MTJ device) by utilizing the giant magneto resistive (GMR) effect or the tunnel magneto-resistance (TMR) effect. An attempt is now made to form an MTJ device, which includes a magnetic material, by performing plasma etching.

For example, JP-A-2005-314791 discloses a method in which high frequency is used to generate plasma from reaction gas, which contains hydrocarbon compound gas, gas of a compound having oxygen atom, and gas of a compound having nitrogen atom, and the metallic magnetic material film is etched using this plasma. This document also discloses that a fluorocarbon compound is used as the etching gas.

However, the problem with this method is that a conductive magnetic film is formed on the side wall of an MTJ device with the result that the magnetic films, provided on and under the insulator, are short-circuited. Thus, the insulator used in this method does not show a great magneto-resistance effect.

To solve this problem, JP-A-2003-78184 discloses a method in which a first magnetic layer, a non-magnetic layer, and a second magnetic layer are dry-etched in this order.

At this time, though a fence is formed by a re-deposit on the work cross-section (that is, on the device side wall), this method uses nitrogen as the etching gas to increase the electric resistance of the re-deposit so that the decrease in the magnetic resistance effects of the film can be reduced.

SUMMARY OF THE INVENTION

However, the related art is based on the premise that a deposit is formed on the pattern side wall, meaning that the deposit on the pattern side wall makes it difficult to form an MTJ device in a vertical shape.

In view of the foregoing, the present invention provides a plasma etching method for a magnetic film to fabricate an MTJ device in the vertical shape without deteriorating the device characteristics.

According to an aspect of the present invention, there is provided with a plasma etching method for performing plasma etching on a sample using a hard mask, the sample having laminated films containing a variable layer of a magnetic film, a barrier layer of an insulating material, and a fixed layer of a magnetic film, the hard mask including at least one of a Ta film and a TiN film, the plasma etching method comprising: a first step of etching the laminated films using $N_2$ gas; and a second step of etching the laminated films after the first step using mixed gas of $N_2$ gas and gas containing carbon elements.

According to another aspect of the present invention, there is provided with a plasma etching method for performing plasma etching on a sample using a hard mask, the sample having laminated films containing a variable layer of a magnetic film, a barrier layer of an insulating material, and a fixed layer of a magnetic film, the hard mask including at least one of a Ta film and a TiN film, the plasma etching method comprising: a first step of etching the laminated films using mixed gas of $N_2$ gas and gas containing carbon elements; a second step of etching the laminated films after the first step using $N_2$ gas; and a third step of etching the laminated films after the second step using mixed gas of $N_2$ gas and gas containing carbon elements.

According to the present invention, the plasma etching method for a magnetic film provides a vertically shaped MTJ device without deteriorating the device characteristics.

Other objects, features and advantages of the invention will become apparent from the following description of the embodiments of the invention taken in conjunction with the accompanying drawings.

DETAILED DESCRIPTION OF THE EMBODIMENTS

Embodiments of a plasma etching method for a magnetic material according to the present invention will be described in detail below with reference to FIG. 1 to FIG. 7D.

Figure 1:
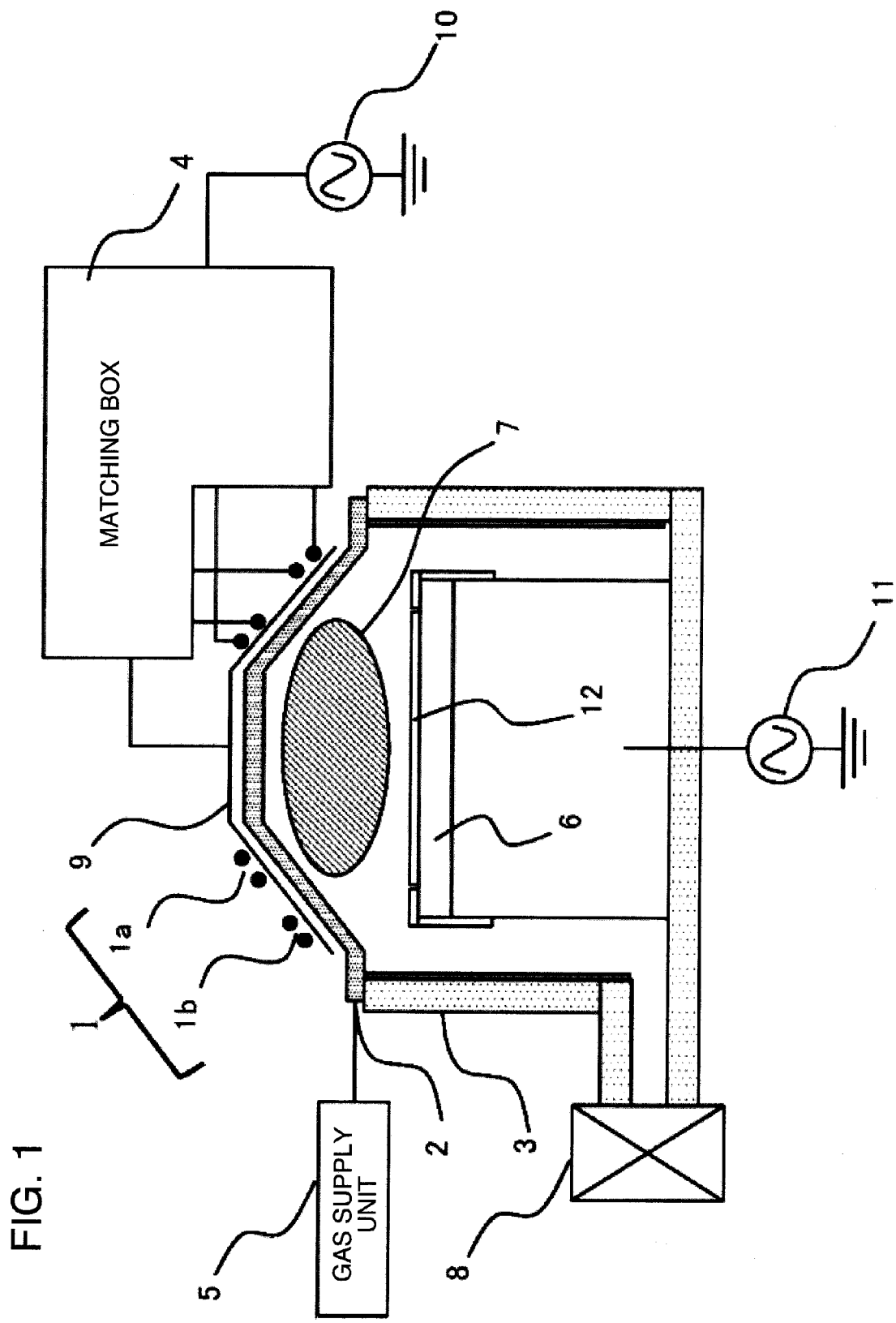
FIG. 1 is a diagram showing the general cross section of a plasma etching device according to the present invention.

FIG. 1 is a diagram showing the general cross section of a plasma etching device used in the present invention. The plasma etching device includes a discharging unit 2 that is made of non-conductive material of quartz ($SiO_2$) or ceramic ($Al_2O_3$) and forms a plasma generation unit, an inductively coupled antenna 1 that is inductively coupled with plasma 7, a Faraday shield 9 that is capacitively coupled with the plasma 7, a first radio-frequency power source 10 that supplies radio-frequency power to the inductively coupled antenna 1 and the Faraday shield 9 via a matching box 4, an electrode 6 on which a sample 12 to be processed is mounted and which is provided in a processing unit 3, a second radio-frequency power source 11 that supplies radio-frequency power to the electrode 6, a gas supply unit 5 that supplies processing gas to the discharging unit 2, and an exhaust unit 8 that exhausts gas from the processing unit 3.

The processing unit 3 is grounded, and the electrode 6 is installed in the processing unit 3 via an insulating material. The inductively coupled antenna 1 includes a coil-shaped first inductively coupled antenna 1a and a coli-shaped second inductively coupled antenna 1b that is larger than the diameter of the first inductively coupled antenna 1a.

Processing gas is supplied from the gas supply unit 5 to the processing unit 3 and, at the same time, gas is exhausted by the exhaust unit 8 to reduce the pressure of the processing unit 3 to a predetermined level. Processing gas, supplied from the gas supply unit 5 to the inside of the processing unit 3, is converted to plasma by means of the induced magnetic field generated by the inductively coupled antenna 1.

A bias voltage is applied from the second radio-frequency power source 11 to the electrode 6 to attract ion, included in the plasma 7, onto the sample 12. This plasma etching device, with a structure suitable for the etching of a nonvolatile etching material, applies radio-frequency voltage to the Faraday shield 9 to prevent the accumulation of a byproducts on the discharging unit 2 and to remove the accumulated byproducts.

Next, the following describes the plasma etching method of the present invention in which the plasma etching device described above is used.

[First Embodiment]

Figure 2A:
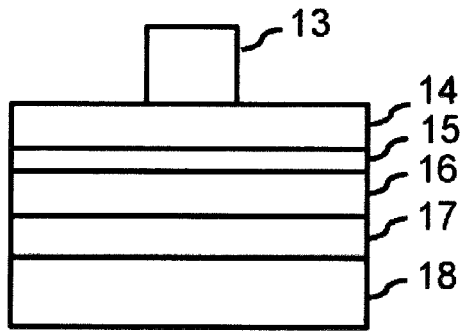
FIGS. 2A-2D are flow diagrams showing the plasma etching method in a first embodiment.

First, FIG. 2A shows the film structure of the sample 12 used in the present invention. This is the sample 12 for forming an MTJ device. On a silicon substrate 18, the films are laminated from bottom to top in the following order: a Ta film 17 that is the bottom electrode, a CoFeB film 16 that is a fixed layer, an MgO film 15 that is a barrier layer, a CoFeB film 14 that is a variable layer, and a Ta film 13 that is the top electrode.

TABLE 1

| Step | $N_2$ | He | $CH_4$ | Processing pressure | Source RF power | Bias RF power | Processing time |
|---|---|---|---|---|---|---|---|
| | ml/min | | | Pa | W | W | Second |
| 1 | 80 | 0 | 0 | 0.3 | 1600 | 450 | 115 |
| 2 | 80 | 77 | 3 | 0.3 | 1600 | 200 | 60 |
| 3 | 80 | 77 | 3 | 0.3 | 1600 | 200 | 120 |

Figure 2B:
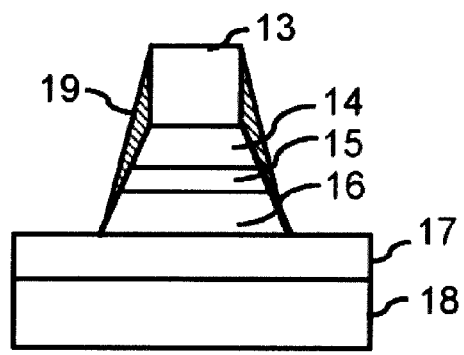

With the Ta film 13 as the mask, etching is performed on the CoFeB film 14, MgO film 15, and CoFeB film 16 according to the condition shown in step 1 in Table 1. The condition is that the flow rate of $N_2$ gas is 80 ml/min, the processing pressure is 0.3 Pa, the source RF power is 1600 W, the bias RF power is 450 W, and the processing time is 115 seconds. Then, the shape of the MTJ device is changed to the tapered shape as shown in FIG. 2B with a byproducts 19, which contains Ta components, deposited on the side wall extending from the Ta film 13 to the CoFeB film 16. In the above description, the source RF power refers to a radio-frequency power supplied from the first radio-frequency power source 10 to the inductively coupled antenna 1, and the bias RF power refers to a radio-frequency power supplied from the second radio-frequency power source 11 to the electrode 6.

Figure 3:
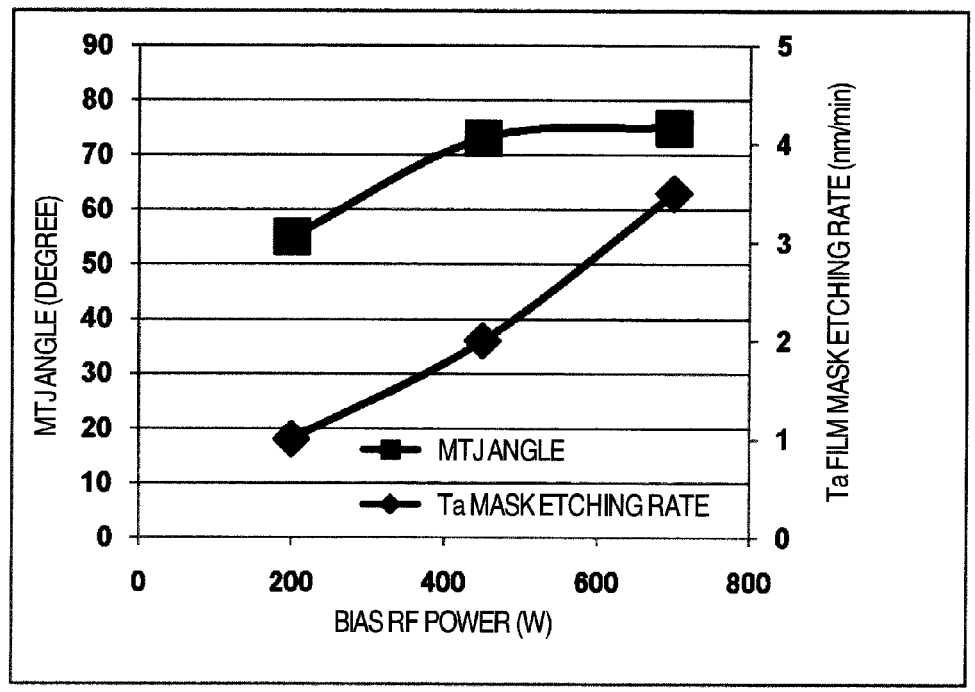
FIG. 3 is a diagram showing how the angle of the shape of an MTJ device depends on the bias RF power.

Because the chemical reaction of the $N_2$ gas is small, the shape formed in step 1 depends on the bias RF power. When the bias RF power is increased from 200 W to 450 W as shown in FIG. 3, the angle of the shape of the MTJ device is improved from 55 degrees to 73 degrees. However, when the bias power is increased from 450 W to 700 W, the angle of the shape of the MTJ device is improved from 73 degrees to 75 degrees with little or no improvement.

The angle of the shape of the MTJ device does not improve much when the bias RF power is in the range from 450 W to 700 W. This is because, when the bias RF power is increased, the etching rate of the mask of the Ta film 13 is increased, causing a larger amount of byproducts, generated from the mask of the Ta film 13, to be deposited near the pattern.

The result in FIG. 3 indicates that sputter etching is used primarily for etching an MTJ device because a high bias RF power makes it easier to produce a vertical shape than a low bias RF power. In addition, it is considered that the bias RF power, if too high, shows little or no improvement in the angle of the shape of an MTJ device because of the byproducts generated from the mask of the Ta film 13. Considering this fact, the bias RF power is set to 450 W in step 1 in this embodiment.

One of the etching parameters other than the bias RF power is the processing pressure. To efficiently exhaust the byproducts generated on the sample 12, it is desirable to set the processing pressure to 0.5 Pa or lower. To ensure highly selective etching with respect to the mask of the Ta film 13, it is desirable that the flow rate of $N_2$ gas be 50 ml/min or higher and the source RF power be 1500 W or higher.

Figure 2C:
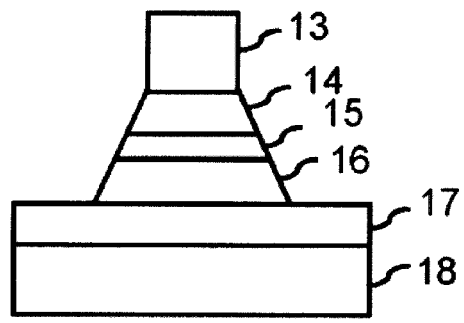

Next, the byproducts 19 accumulated on the side wall of the Ta film 13, CoFeB film 14, MgO film 15, and CoFeB film 16 is removed as shown in FIG. 2C according to the condition shown in step 2 in Table 1. The condition is that the flow rate of $N_2$ gas is set to 80 ml/min, the flow rate of He gas is set to 77 ml/min, the flow rate of $CH_4$ gas is set to 3 ml/min, the processing pressure is set to 0.3 Pa, the source RF power is set to 1600 W, the bias RF power is set to 200 W, and the processing time is set to 60 seconds.

The byproducts 19, generated by the etching in step 1, contains the Ta film 13 of the mask, CoFeB film 14, and CoFeB film 16. Therefore, sputter etching is efficient to remove the byproducts 19. However, when sputter etching is used to remove the byproducts 19, the Ta film 13 of the mask also becomes easier to be removed. Therefore, to remove the byproducts 19 but not to remove much of the Ta film 13 of the mask, accumulative gas, which contains carbon elements, is added to the $N_2$ gas when removing the byproducts 19.

In this embodiment, $CH_4$ (methane) gas is used as the gas containing carbon elements and, in addition, He gas is added. The addition of He (helium) gas reduces the partial pressure of the $N_2$ (nitrogen) gas, making it possible to remove the byproducts 19 efficiently.

Figure 4:
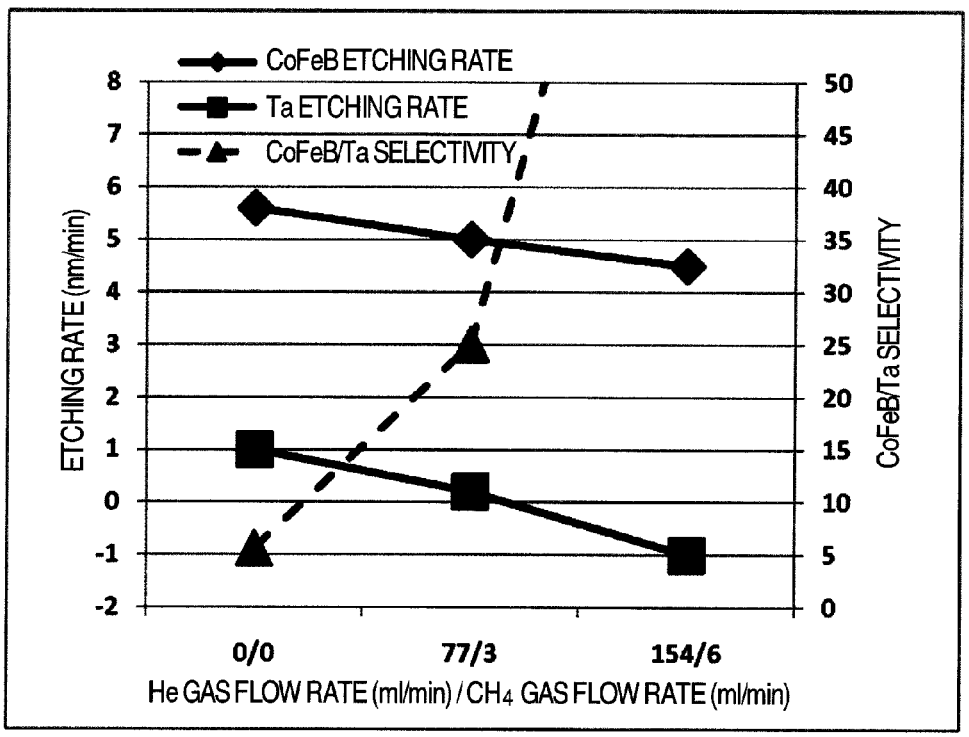
FIG. 4 is a diagram showing how the selectivity of a CoFeb film with respect to a Ta film depends on the flow rate of the mixed gas of He gas and $CH_4$ gas.

The selectivity of the CoFeB film with respect to the Ta film is calculated when mixed gas of $N_2$ gas, He gas, and $CH_4$ gas is used while changing the flow rate of He gas and the flow rate of $CH_4$ gas. FIG. 4 shows the selectivity of the CoFeB film with respect to the Ta film when the flow rate of the $N_2$ gas is fixed at 80 ml/min and when the flow rate of He gas and the flow rate of $CH_4$ gas are set to 0 ml/min and 0 ml/min (0/0), to 77 ml/min and 3 ml/min (77/3), and to 154 ml/min and 6 ml/min (154/6), respectively.

FIG. 4 shows that the etching rate of the Ta film can be set almost to 0 ml/min while maintaining the etching rate of the CoFeB film when the flow rate of $N_2$ gas, He gas, and $CH_4$ gas are 80 ml/min, 77 ml/min, and 3 ml/min, respectively.

Figure 2D:
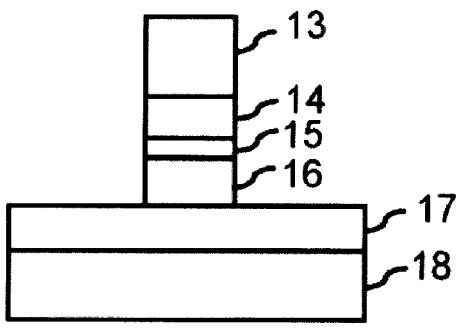

Next, plasma etching is performed on the CoFeB film 14, MgO film 15, and CoFeB film 16 according to the condition shown in step 3 in Table 1 to change the shape of the CoFeB film 14, MgO film 15, and CoFeB film 16 from the tapered shape, such as that shown in FIG. 2C, to the vertical shape, such as that shown in FIG. 2D. The condition is that the flow rate of $N_2$ gas is 80 ml/min, the flow rate of He gas is 77 ml/min, the flow rate of $CH_4$ gas is 3 ml/min, the processing pressure is 0.3 Pa, the source RF power is 1600 W, the bias RF power is 200 W, and the processing time is 120 seconds.

Figure 5:
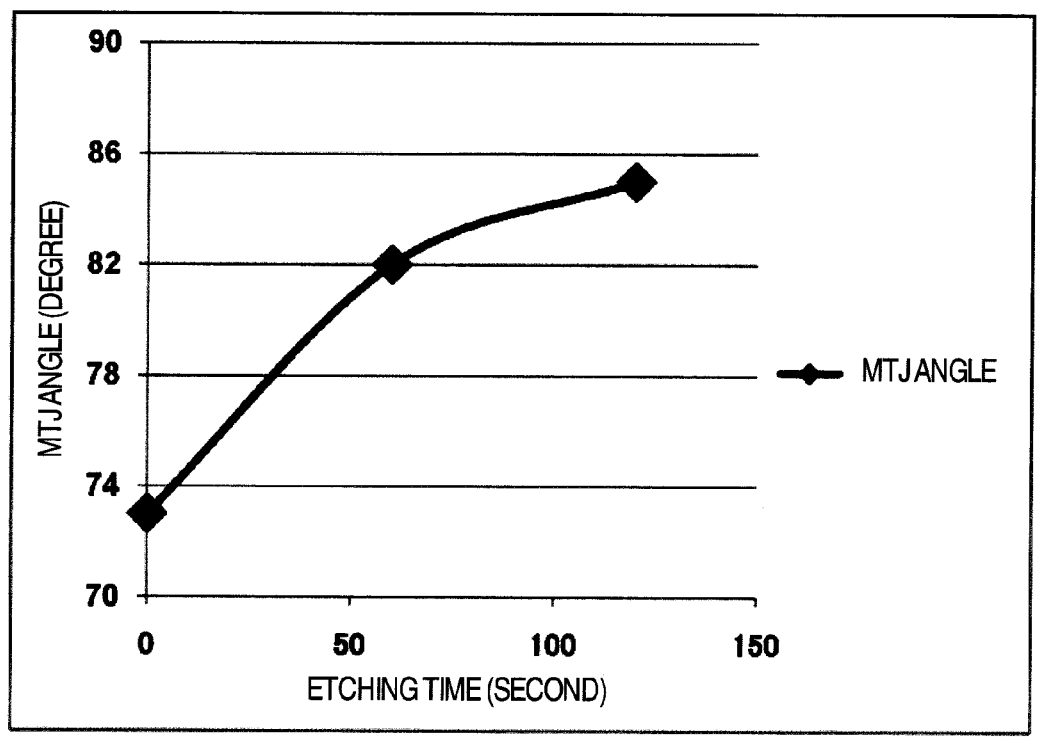
FIG. 5 is a diagram showing how the angle of an MTJ shape depends on the etching time.

The etched shape after step 3 is changed from the tapered shape to the vertical shape as the processing time in step 3 increases as shown in FIG. 5. For example, the angle of the etched shape is 82 degrees when the processing time is 60 seconds, and the angle of the etched shape is 85 degrees when the processing time is 120 seconds.

As described above, performing processing in step 1 to step 3 in Table 1 enables the MTJ device to be plasma-etched vertically without a short circuit between the variable layer (CoFeB film 14) and the fixed layer (CoFeB film 16).

To increase the selectivity of the CoFeB film with respect to the Ta film, it is desirable to set the flow rate of the $CH_4$ gas, used in step 2 and step 3, to 3 ml/min or higher as shown in FIG. 4. Although mixed gas of $N_2$ gas, He gas, and $CH_4$ gas is used in step 2 and step 3 in this embodiment, mixed gas of $N_2$ gas and $CH_4$ gas gives an effect similar to that of this embodiment.

In addition, though $CH_4$ gas is used as gas containing carbon elements in this embodiment, any one of $C_2H_6$ (ethane) gas, $C_3H_8$ (propane) gas, $C_4H_{10}$ (butane) gas, $C_5H_{12}$ (pentane) gas, $C_2H_4$ (ethylene) gas, and $C_2H_2$ (acetylene) gas may be used.

Next, the following describes an example in which the present invention is applied to the sample 12 for forming an MTJ device whose mask of the Ta film 13, used in this embodiment, is made thinner.

[Second Embodiment]

Figure 6A:
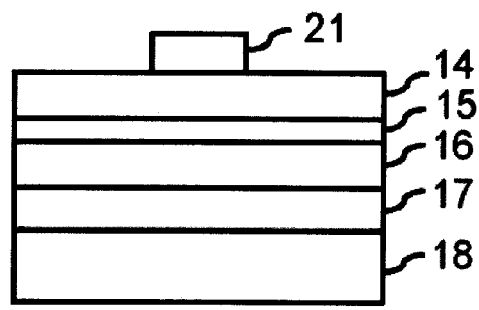
FIGS. 6A-6D are flow diagrams showing a plasma etching method in a second embodiment.

First, FIG. 6A shows the film structure of a sample 12 used in the present invention. This is the sample 12 for forming an MTJ device. On a silicon substrate 18, the films are laminated from bottom to top in the following order: a Ta film 17 that is the bottom electrode, a CoFeB film 16 that is a fixed layer, an MgO film 15 that is a barrier layer, a CoFeB film 14 that is a variable layer, and a Ta film 21 that is the top electrode. The Ta film 21 is half as thick as the Ta film 13 in the first embodiment.

TABLE 2

| Step | $N_2$ ml/min | He ml/min | $CH_4$ ml/min | Processing pressure Pa | Source RF power W | Bias RF power W | Processing time Second |
|---|---|---|---|---|---|---|---|
| 1 | 80 | 0 | 0 | 0.3 | 1600 | 450 | 115 |
| 2 | 80 | 77 | 3 | 0.3 | 1600 | 200 | 30 |
| 3 | 80 | 77 | 3 | 0.3 | 1600 | 200 | 120 |

Figure 6B:
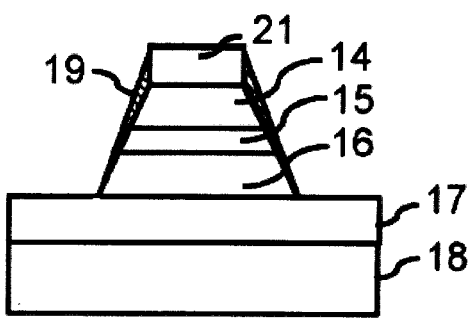

First, with the Ta film 21 as the mask, etching is performed on the CoFeB film 14, MgO film 15, and CoFeB film 16 according to the condition shown in step 1 in Table 2. The condition is that the flow rate of $N_2$ gas is 80 ml/min, the processing pressure is 0.3 Pa, the source RF power is 1600 W, the bias RF power is 450 W, and the processing time is 115 seconds. Then, the shape of the MTJ device is changed to the tapered shape as shown in FIG. 6B with a byproducts 19, which contains Ta components, deposited on the side wall extending from the Ta film 21 to the CoFeB film 16. In the above description, the source RF power refers to a radio-frequency power supplied from the first radio-frequency power source 10 to the inductively coupled antenna 1, and the bias RF power refers to a radio-frequency power supplied from the second radio-frequency power source 11 to the electrode 6.

Figure 6C:
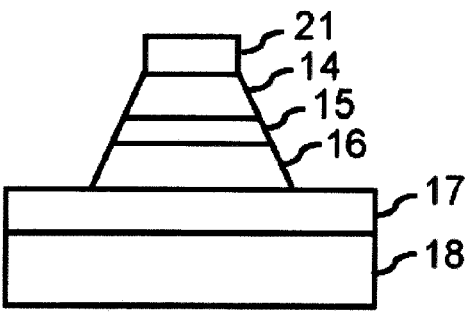
Figure 6D:
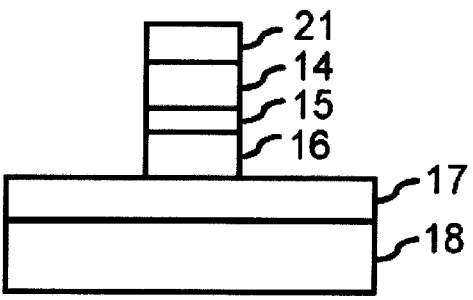

Next, the byproducts 19 is removed as shown in FIG. 6C according to the condition shown in step 2 in Table 2. That is, the flow rate of $N_2$ gas is set to 80 ml/min, the flow rate of He gas is set to 77 ml/min, the flow rate of $CH_4$ gas is set to 3 ml/min, the processing pressure is set to 0.3 Pa, the source RF power is set to 1600 W, the bias RF power is set to 200 W, and the processing time is set to 30 seconds.

The processing time of step 2 in the first embodiment is 60 seconds while the processing time of step 2 in this embodiment is reduced to 30 seconds. This is because the Ta film 21 in this embodiment is half as thick as the Ta film 13 in the first embodiment and, therefore, the amount of accumulation of the byproducts 19 on the side wall of the Ta film 21, CoFeB film 14, MgO film 15, and CoFeB film 16 is reduced as compared to that in the first embodiment.

Next, plasma etching is performed on the taper-shaped CoFeB film 14, MgO film 15, and CoFeB film 16 according to the condition shown in step 3 in Table 2. The condition is that the flow rate of $N_2$ gas is 80 ml/min, the flow rate of He gas is 77 ml/min, the flow rate of $CH_4$ gas is 3 ml/min, the processing pressure is 0.3 Pa, the source RF power is 1600 W, the bias RF power is 200 W, and the processing time is 120 seconds. This plasma etching creates a vertically shaped CoFeB film 14, MgO film 15, and CoFeB film 16 such as that shown in FIG. 6D.

As described above, performing processing in step 1 to step 3 shown in Table 2 enables the MTJ device to be plasma-etched vertically without a short circuit between the variable layer (CoFeB film 14) and the fixed layer (CoFeB film 16). In addition, the total processing time from step 1 to step 3 is reduced as compared to that in the first embodiment.

To increase the selectivity of the CoFeB film with respect to the Ta film, it is desirable to set the flow rate of the $CH_4$ gas, used in step 2 and step 3, to 3 ml/min or higher as shown in FIG. 4. Although mixed gas of $N_2$ gas, He gas, and $CH_4$ gas is used in step 2 and step 3 in this embodiment, mixed gas of $N_2$ gas and $CH_4$ gas gives an effect similar to that of this embodiment.

In addition, though $CH_4$ gas is used as gas containing carbon elements in this embodiment, any one of $C_2H_6$ (ethane) gas, $C_3H_8$ (propane) gas, $C_4H_{10}$ (butane) gas, $C_5H_{12}$ (pentane) gas, $C_2H_4$ (ethylene) gas, and $C_2H_2$ (acetylene) gas may be used.

Next, the following describes an example in which plasma etching different from that is the first embodiment is applied to a sample 12 having the film structure similar to that in the first embodiment.

[Third Embodiment]

Figure 7A:
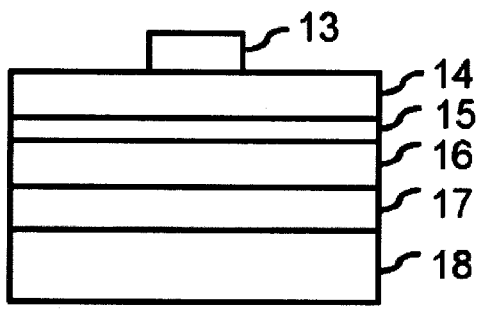
FIGS. 7A-7D are flow diagrams showing a plasma etching method in a third embodiment.

First, FIG. 7A shows the film structure of a sample 12 used in the present invention. This is the sample 12 for forming an MTJ device. On a silicon substrate 18, the films are laminated from bottom to top in the following order: a Ta film 17 that is the bottom electrode, a CoFeB film 16 that is a fixed layer, an MgO film 15 that is a barrier layer, a CoFeB film 14 that is a variable layer, and a Ta film 13 that is the top electrode.

TABLE 3

| Step | $N_2$ ml/min | He ml/min | $CH_4$ ml/min | Processing pressure Pa | Source RF power W | Bias RF power W | Processing time Second |
|---|---|---|---|---|---|---|---|
| 1 | 80 | 77 | 3 | 0.3 | 1600 | 450 | 125 |
| 2 | 80 | 0 | 0 | 0.3 | 1600 | 200 | 20 |
| 3 | 80 | 77 | 3 | 0.3 | 1600 | 200 | 120 |

Figure 7B:
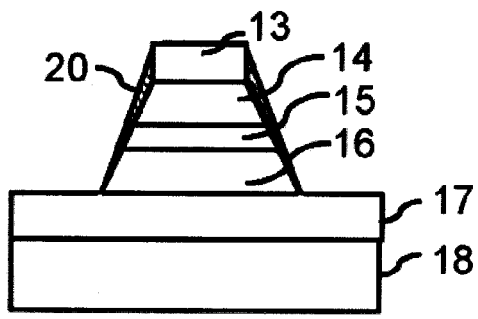

First, with the Ta film 13 as the mask, etching is performed on the CoFeB film 14, MgO film 15, and CoFeB film 16 according to the condition shown in step 1 in Table 3. The condition is that the flow rate of $N_2$ gas is 80 ml/min, the flow rate of He gas is 77 ml/min, the flow rate of $CH_4$ gas is 3 ml/min, the processing pressure is 0.3 Pa, the source RF power is 1600 W, the bias RF power is 450 W, and the processing time is 125 seconds. Then, the shape of the sample 12 is changed to the tapered shape as shown in FIG. 7B with byproducts 20 deposited on the side wall extending from the Ta film 13 to the CoFeB film 16.

Unlike the byproducts 19 in the first embodiment, the byproducts 20 in this case contains carbon elements. In the above description, the source RF power refers to a radio-frequency power supplied from the first radio-frequency power source 10 to the inductively coupled antenna 1, and the bias RF power refers to a radio-frequency power supplied from the second radio-frequency power source 11 to the electrode 6.

Figure 7C:
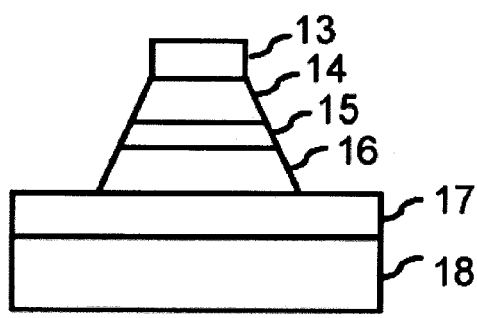
Figure 7D:
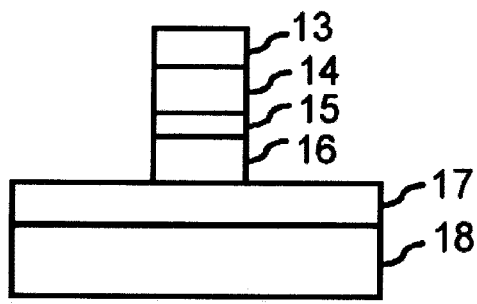

Next, the byproducts 20, accumulated on the side wall of the Ta film 13, CoFeB film 14, MgO film 15, and CoFeB film 16, is removed as shown in FIG. 7C according to the condition shown in step 2 in Table 3. The condition is that the flow rate of $N_2$ gas is 80 ml/min, the processing pressure is 0.3 Pa, the source RF power is set to 1600 W, the bias RF power is 200 W, and the processing time is 20 seconds.

The etching of the resist material (carbonaceous material) according to the condition in step 2 results in an etching speed of 200 nm/min or higher. The etching rate of the CoFeB film according to the condition in step 2 is about 6 nm/min as shown in FIG. 4, meaning that the etching rate of the resist material (carbonaceous material) is much faster than that of the CoFeB film.

The byproducts 20 in this embodiment contains more carbon elements than magnetic materials and is accumulated on the pattern side wall. Therefore, the byproducts 20 can be removed easily in step 2. Magnetic materials, if included in the byproducts containing carbon elements, are removed in the lift-off process at the same time the byproducts containing carbon elements is removed.

Next, plasma etching is performed on the taper-shaped CoFeB film 14, MgO film 15, and CoFeB film 16 according to the condition shown in step 3 in Table 3. The condition is that the flow rate of $N_2$ gas is 80 ml/min, the flow rate of He gas is 77 ml/min, the flow rate of $CH_4$ gas is 3 ml/min, the processing pressure is 0.3 Pa, the source RF power is 1600 W, the bias RF power is 200 W, and the processing time is 120 seconds. This plasma etching creates vertically shaped CoFeB film 14, MgO film 15, and CoFeB film 16 such as those shown in FIG. 7D.

As described above, performing processing in step 1 to step 3 shown in Table 3 enables the MTJ device to be plasma-etched vertically without a short circuit between the variable layer (CoFeB film 14) and the fixed layer (CoFeB film 16).

Although $N_2$ gas is used in step 2 in this embodiment, mixed gas of $N_2$ (flow rate is 130 ml/min), He gas (flow rate is 29 ml/min), and $CH_4$ gas (flow rate is 1.0 ml/min), such as those shown in step 2 in Table 4, gives an equivalent effect as this embodiment.

TABLE 4

| Step | $N_2$ ml/min | He ml/min | $CH_4$ ml/min | Processing pressure Pa | Source RF power W | Bias RF power W | Processing time Second |
|---|---|---|---|---|---|---|---|
| 1 | 80 | 77 | 3 | 0.3 | 1600 | 450 | 125 |
| 2 | 130 | 29 | 1 | 0.3 | 1600 | 200 | 20 |
| 3 | 80 | 77 | 3 | 0.3 | 1600 | 200 | 120 |

To increase the selectivity of the CoFeB film with respect to the Ta film, it is desirable to set the flow rate of the $CH_4$ gas, used in step 2 and step 3, to 3 ml/min or higher as shown in FIG. 4. Although mixed gas of $N_2$ gas, He gas, and $CH_4$ gas is used in step 2 and step 3 in this embodiment, mixed gas of $N_2$ gas and $CH_4$ gas gives an effect similar to that of this embodiment.

In addition, though $CH_4$ gas is used as gas containing carbon elements in this embodiment, any one of $C_2H_6$ (ethane) gas, $C_3H_8$ (propane) gas, $C_4H_{10}$ (butane) gas, $C_5H_{12}$ (pentane) gas, $C_2H_4$ (ethylene) gas, and $C_2H_2$ (acetylene) gas may be used.

Although a CoFeB film is used for the variable layer and the fixed layer in the first embodiment to the third embodiment described above, a magnetic film containing at least one of the elements of Fe, Co, Ni, Pt, and Mn may be used in the present invention. Although a Ta film is used for the top electrode and the bottom electrode in the first embodiment to the third embodiment described above, it is only required in the present invention that the film be at least one of a Ta film and a TiN film.

In addition, though the variable layer is provided above the fixed layer in an example of an MTJ device in the first embodiment to the third embodiment described above, it is also possible to provide the fixed layer above the variable layer in an MTJ device according to the present invention.

Although an example in which an inductively coupled plasma source plasma-etching device is described in the first embodiment to the third embodiment described above, the present invention is not limited to this type of device. A microwave electron cyclotron resonance (ECR) plasma etching device, a capacitively coupled plasma source plasma etching device, or a helicon source plasma etching device may also be used.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma etching method for performing plasma etching on a sample using a hard mask, the sample having laminated films containing a first magnetic film, a barrier layer of an insulating material underlying the first magnetic film, and a second magnetic film underlying the barrier layer of the insulating material, the hard mask including at least one of a Ta film and a TiN film, the plasma etching method comprising:
    a first step of etching the laminated films using a gas consisting of $N_2$ gas; and
    a second step of etching the laminated films etched in the first step using a mixed gas consisting of $N_2$ gas, $CH_4$ gas and He gas.

2. The plasma etching method according to claim 1 wherein
    each of the first magnetic film and the second magnetic film is a film containing at least one of elements of Fe, Co, Ni, Pt, and Mn.

3. The plasma etching method according to claim 1, wherein in said first step, byproducts of the etching are deposited on side surfaces of the laminated films, and in the second step, the byproducts are removed.

4. The plasma etching method according to claim 1, consisting of said first step and said second step.

5. A plasma etching method for performing plasma etching on a sample using a hard mask, the sample having laminated films containing a first magnetic film, a barrier layer of an insulating material underlying the first magnetic film, and a second magnetic film underlying the barrier layer of the insulating material, the hard mask including at least one of a Ta film and a TiN film, the plasma etching method comprising:
    a first step of etching the laminated films using a mixed gas consisting of $N_2$ gas, $CH_4$ gas and He gas;
    a second step of etching the laminated films etched in the first step using a gas consisting of $N_2$ gas; and
    a third step of etching the laminated films etched in the second step using a mixed gas consisting of $N_2$ gas, $CH_4$ gas and He gas.

6. The plasma etching method according to claim 5 wherein
    each of the first magnetic film and the second magnetic film is a film containing at least one of elements of Fe, Co, Ni, Pt, and Mn.

7. The plasma etching method according to claim 5, wherein in said first step, byproducts of the etching are deposited on side surfaces of the laminated films, and in the second step, the byproducts are removed.

8. The plasma etching method according to claim 5, consisting of said first step, said second step and said third step.

* * * * *